US007170307B2

(12) United States Patent
Strom

(10) Patent No.: US 7,170,307 B2
(45) Date of Patent: Jan. 30, 2007

(54) SYSTEM AND METHOD OF MITIGATING EFFECTS OF COMPONENT DEFLECTION IN A PROBE CARD ANALYZER

(75) Inventor: John T. Strom, North Bend, WA (US)

(73) Assignee: Applied Precision, LLC, Issaquah, WA (US)

( * ) Notice: Subject to any disclaimer, the term of this patent is extended or adjusted under 35 U.S.C. 154(b) by 0 days.

(21) Appl. No.: 10/799,575

(22) Filed: Mar. 12, 2004

(65) Prior Publication Data

US 2004/0227533 A1 Nov. 18, 2004

Related U.S. Application Data

(60) Provisional application No. 60/454,574, filed on Mar. 14, 2003.

(51) Int. Cl.
*G01R 31/02* (2006.01)
(52) U.S. Cl. ...................... 324/758; 324/754
(58) Field of Classification Search ............... 324/758
See application file for complete search history.

(56) References Cited

U.S. PATENT DOCUMENTS 4,195,259 A * 3/1980 Reid et al. .................. 324/754

| | | | |
|---|---|---|---|
| 4,201,939 A * | 5/1980 | Lee et al. .................. 324/754 |
| 4,687,324 A * | 8/1987 | Selbach ..................... 356/3.12 |
| 5,657,394 A | 8/1997 | Schwartz .................... 382/151 |
| 5,861,759 A * | 1/1999 | Bialobrodski et al. ...... 324/758 |
| 5,920,068 A * | 7/1999 | Marsh ........................ 250/309 |
| 6,002,426 A | 12/1999 | Back .......................... 348/87 |
| 6,040,700 A | 3/2000 | Berar ......................... 324/754 |
| 6,043,668 A | 3/2000 | Carney ....................... 324/758 |
| 6,448,764 B2 * | 9/2002 | Noe et al. ................... 324/209 |
| 6,710,798 B1 * | 3/2004 | Hershel et al. .............. 348/87 |
| 6,720,789 B1 * | 4/2004 | Audette et al. ............. 324/765 |
| 6,870,382 B2 * | 3/2005 | Harris ........................ 324/758 |
| 2004/0222808 A1 * | 11/2004 | Strom et al. ................ 324/758 |
| 2004/0227533 A1 * | 11/2004 | Strom ........................ 324/758 |
| 2005/0157302 A1 * | 7/2005 | Krambeer et al. .......... 356/429 |

FOREIGN PATENT DOCUMENTS

DE 20004439 U1 10/2000
JP 05157790 6/1993

* cited by examiner

*Primary Examiner*—Paresh Patel
(74) *Attorney, Agent, or Firm*—Pillsbury Winthrop Shaw Pittman LLP

(57) ABSTRACT

A system and method of mitigating the effects of component deflections in a probe card analyzer system may implement three-dimensional comparative optical metrology techniques to model deflection characteristics. An exemplary system and method combine non-bussed electrical planarity measurements with fast optical planarity measurements to produce "effectively loaded" planarity measurements.

7 Claims, 5 Drawing Sheets

SYSTEM AND METHOD OF MITIGATING EFFECTS OF COMPONENT DEFLECTION IN A PROBE CARD ANALYZER

CROSS-REFERENCE TO RELATED APPLICATIONS

The present application claims the benefit of U.S. provisional application Ser. No. 60/454,574, filed Mar. 14, 2003, entitled "MITIGATING THE EFFECTS OF PROBE CARD/FIXTURE AND METROLOGY BASE DEFLECTION IN A PROBE CARD ANALYZER," the disclosure of which is hereby incorporated herein by reference in its entirety.

FIELD OF THE INVENTION

Aspects of the present invention relate generally to the field of probe card analyzers, and more particularly to a system and method of mitigating the effects of component deflections in a probe card analyzer system.

BACKGROUND OF THE INVENTION

Traditional probe card analyzers measure probe planarity by electrical means, and generally measure probe alignment by optical means. Electrical planarity measurements are typically made by slowly bringing a conductive contact surface into contact with the probes on a probe card. In that regard, the conductive contact surface is moved toward the probe card; the conductive surface first makes contact with the probe that extends furthest from the probe card surface (the "lowest" probe), and finally makes contact with the probe that extends least from the probe card surface (the "highest" probe). In this context, the terms "lowest" and "highest" are not necessarily intended to imply a vertical orientation. The process of moving the conductive contact surface from first to last contact point and beyond is generally referred to in the art as "overtravel," since the first probe to make contact with the conductive contact surface is loaded beyond the point of first contact.

As probes are "overtraveled," the contact loads increase. For probe cards implementing many probes, these contact loads can become quite high, and are capable of producing deflections in system components that may significantly impact the accuracy of measurement results.

In a typical probe card analyzer system taking electrical planarity measurements across a single large contact surface, the deflection of the probe card, the probe card fixture, the metrology frame, or some combination thereof, may become an integral part of the planarity measurement itself. This is due to the fact that the loads arising from contact with lower probes cause deflection, which in turn increases the apparent planarity of higher probes.

Optical planarity measurements, on the other hand, may be made by optically scanning the tips of free-hanging probes. Under such conditions (i.e., free-hanging probes with no overtravel), contact loads are never created, and hence cannot cause component deflections or flexure of any kind. Accordingly, such optical planarity measurements may differ from electrical planarity measurements, even with respect to the same probe card under analysis. Additionally, optical methodologies generally enjoy a speed advantage over electrical planarity evaluative methods. The rapidity of optical planarity measurements and techniques make such optical technology attractive; it is highly desirable to develop a method of producing equivalent electrical planarity analysis based upon or benefiting from fast optical measurements.

Currently implemented systems and methods are deficient in that traditional methodologies do not accurately correlate optical planarity measurements, which are made in the absence of contact loads, to electrical planarity measurements, which are made in the presence of, and are influenced by, such contact loads.

SUMMARY

Aspects of the present invention overcome the foregoing and other shortcomings of conventional technology, providing a system and method of mitigating the effects of component deflections in a probe card analyzer system. An exemplary system and method combine non-bussed electrical planarity measurements with fast optical planarity measurements to produce "effectively loaded" planarity measurements.

In accordance with one exemplary embodiment, a method of obtaining planarity measurements in a probe card analysis system comprises: computing planarity effects due to fiducial plate deflection; combining planarity effects due to probe card deflection and due to probe card fixture deflection; and responsive to the computing and the combining, calculating a load compensated planarity for the probe card. In some implementations, the method may further comprise accounting for planarity effects due to stage deflection; additionally, the calculating may be further responsive to the accounting. In accordance with one aspect of an exemplary method, the accounting comprises utilizing a distance sensor proximate to the stage deflection.

The computing may comprise utilizing an optical metrology technique, such as a three-dimensional optical metrology method. In some embodiments, the utilizing an optical metrology technique comprises: acquiring image data of a fiducial on the fiducial plate; responsive to the acquiring, identifying deflection data values representative of a deflection of the fiducial plate; and responsive to the identifying, providing correction data values enabling a first order correction of the deflection. In some alternative embodiments, the method further comprises: further identifying rate data values representative of a rate of deflection of the fiducial plate; and responsive to the further identifying, providing additional correction data values enabling a second order correction of the deflection.

In accordance with another aspect of some embodiments of a planarity measuring method, the combining comprises: obtaining measurements of optical planarity and electrical planarity for the probe card; measuring fiducial plate deflection at first electrical contact; and responsive to the obtaining and the measuring, computing a combined deflection value for the probe card and the probe card fixture.

As set forth below with specific reference to exemplary embodiments, a method of obtaining a combined deflection measurement for deflections of a probe card and a probe card fixture may comprise: obtaining measurements of optical planarity and measurements of electrical planarity for all non-bussed probes; identifying fiducial plate deflection at first electrical contact at all non-bussed probe locations; and responsive to the obtaining and the identifying, computing a combined deflection attributable to deflection of the probe card and deflection of the probe card fixture. Some such methods are disclosed as further comprising acquiring stage deflection measurements at proximal sensor locations, and wherein the computing is further responsive to the acquiring; alternatively, the stage deflection measurements may be assumed to be zero in some applications.

In accordance with some embodiments of a method of obtaining a combined deflection measurement, the operation of identifying fiducial plate deflection comprises: selectively positioning an imaging apparatus to acquire optical data at a selected non-bussed probe location; acquiring the optical data when a non-bussed probe makes contact with the fiducial plate at the selected non-bussed probe location; and responsive to the acquiring, measuring the fiducial plate deflection at the selected non-bussed probe location. The foregoing selectively positioning, acquiring, and measuring may be selectively repeated for a different selected non-bussed probe location.

Alternatively, the operation of identifying fiducial plate deflection may comprise computing the fiducial plate deflection as a function of full overtravel plate deflection at a particular probe location and of optical planarity; the computing may comprise utilizing a two dimensional interpolation calculation to approximate deflections at other probe locations.

The foregoing and other aspects of the disclosed embodiments will be more fully understood through examination of the following detailed description thereof in conjunction with the drawing figures.

DETAILED DESCRIPTION

By way of general background, it will be appreciated that the approach to obtaining optical planarity measurements generally known in the art and set forth by way of example herein is that of three-dimensional comparative metrology using a substantially transparent fiducial substrate, e.g., a glass, acrylic, quartz, or other suitably transparent fiducial plate as set forth in more detail below. While an exemplary three-dimensional comparative metrology technique is described below, other optical planarity assessment methods may be known or developed in accordance with generally known principles. The following description is provided by way of example only and not by way of limitation; the present disclosure is not intended to be limited to any particular method of performing an optical planarity analysis.

Figure 1:
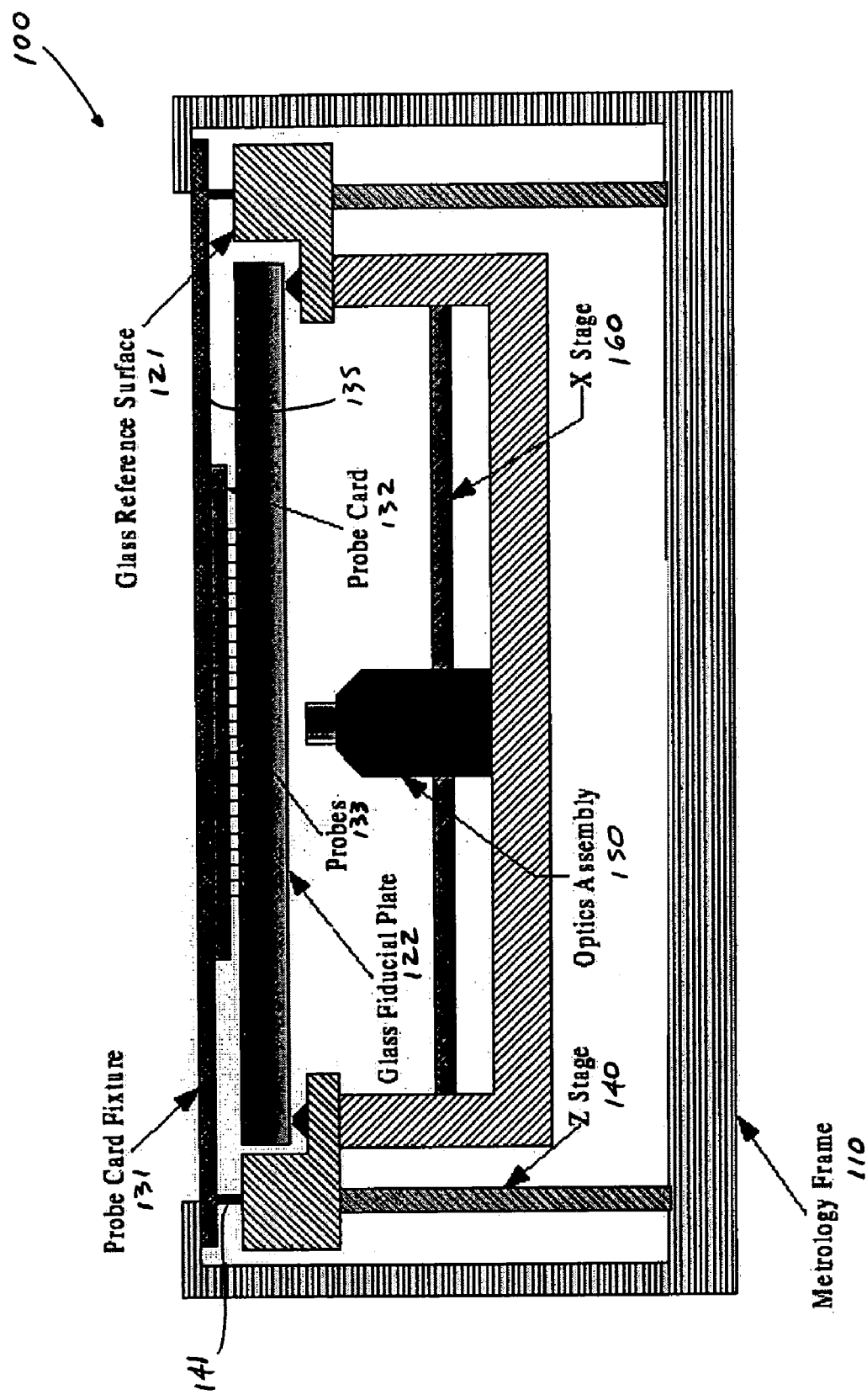
FIG. 1 is a simplified block diagram illustrating components of one embodiment of a probe card analyzer system.

FIG. 1 is a simplified block diagram illustrating components of one embodiment of a probe card analyzer system. As is generally known in the art, system 100 may comprise a metrology frame 110 to which other components are mounted. Specifically, exemplary system 100 generally comprises a plate reference surface 121 configured and operative to carry or otherwise support a substantially transparent fiducial plate 122, a probe card 132 attached to or otherwise supported by a probe card fixture 131, and a z-stage 140 configured and operative to provide relative movement (along an axis, z, e.g., vertically in FIG. 1) between fiducial plate 122 and probe card 132. In some embodiments, one or more sensors, such as z-sensor 141, for example, may measure the relative distance between probe card fixture 131 and plate reference surface 121.

Typically, fiducial plate 122, in addition to being substantially transparent as set forth in more detail below, is also electrically conductive to enable electrical planarity measurements.

Optics assembly 150 may be employed to acquire image data (e.g., visual or optical data) of one or more probes 133 through substantially transparent fiducial plate 122. Accordingly, the term "substantially transparent" as used herein generally refers to the quality of allowing transmission of sufficient energy in at least a portion of the electromagnetic spectrum, such as the visible wavelengths of the spectrum, for example, to allow optics assembly 150 to acquire such images or optical data through fiducial plate 122. It will be appreciated that various factors may affect characterization of a particular fiducial plate 122 as "substantially transparent" in this context. For example, "substantial" transparency may be affected or influenced by some or all of the following, among other factors: transmission properties and attenuation properties (such as the refractive index, the presence and density of any occlusions, etc.) of the material used to construct fiducial plate 122; the thickness of fiducial plate 122 along the optical axis of optics assembly 150; the type (frequency and amplitude, for example) of energy impinging upon or passing through fiducial plate 122; the capabilities and sensitivity of optics or imaging hardware employed at optics assembly 150; and the like. In some embodiments, fiducial plate 122 may be constructed of glass, acrylic, quartz, or a similar material substantially transparent to electromagnetic energy in a predetermined or desired portion of the spectrum.

It will be appreciated that system 100 may also comprise various motors, actuators, positional sensors, and the like (not shown in FIG. 1) configured and generally operative to control relative positioning and orientation of the various components such as z-stage 140, x-stage 160, y-stage (not shown), optics assembly 150, fiducial plate 122, and probe card 132. For example, the operational focal length of optical equipment, lens arrangements, sensors (such as a charge-coupled device (CCD) or complementary metal-oxide semiconductor (CMOS) detector), or other imaging hardware utilized at optics assembly 150 may affect the optimum or desired distance (in the z dimension) between optics assembly 150 and fiducial plate 122. Similarly, selective positioning of optics assembly 150 relative to fiducial plate 122, probe card 132, or both, in either or both of the x and y directions may be required or desired. In many applications, precise three-dimensional positioning and orientation of the various components may be influenced or controlled by one or more computers, micro-controllers, programmable logic controllers, or other electronic or electromechanical components such as stepper motors, worm gears, precision actuators, and the like. Numerous hardware and software configurations suitable for this purpose are generally known in the art, and are susceptible of many variations and modifications. The present disclosure is not intended to be limited by any particular combination of hardware elements and software modules operative selectively to manipulate the components of system 100 in three-dimensional space.

Additionally, various components illustrated in the exemplary FIG. 1 embodiment may be coupled to one or more computers or other processing components. Specifically, a data processing component comprising hardware and software may be configured and operative to receive acquired image data and to compute planarity, for example, or to perform other operations. Such a data processing component may additionally be operative to command or request movement or rotation of various system components to correct for deflections as set forth in more detail below. The present disclosure is not intended to be limited by any particular data processing hardware or software implementation, control electronics, feedback mechanisms, and the like.

As is generally known in the art, one factor underlying the superior speed and efficiency of optical planarity analyses over electrical planarity analytical methodologies is the rapidity and efficiency with which the planarity of bussed probes can be measured using the optical technology.

In some embodiments, a system and method constructed and operative in accordance with the present disclosure combine non-bussed electrical planarity measurements with fast optical planarity measurements to produce "effectively loaded" planarity measurements. Specifically, aspects of the present invention are related to acquiring fast measurements of planarity that incorporate the effects of deflection under load that are present in typical electrical planarity measurements. Furthermore, exemplary approaches as outlined herein also produce useful measurements of the combined deflection under load of probe card 132 and probe card fixture 131.

As contemplated herein, and further by way of background, the following terminology will be used to describe various methods for measuring planarity:

"electrical planarity" generally refers to electrical planarity measurements of non-bussed probes acquired in a loaded condition (i.e., under contact load);

"optical planarity" or "unloaded planarity" generally refer to optical planarity measurements of all probes acquired in a no-load condition (i.e., under no contact load); and "loaded planarity" generally refers to hybrid planarity measurements of all probes acquired under load; in this context, load planarity measurements may be derived from a combination of fast optical and fast non-bussed electrical planarity measurements. These measurements generally may incorporate the effects of deflection under load, and hence may be related to or correlated with "electrical planarity" measurements.

In order to calculate loaded planarity, a determination may first be made of the magnitude of deflections or flexures associated with various system components; as set forth in general above, these deflections or flexures may occur during the measurement of electrical planarity when one or more probes are subjected to loading as a result of an overtravel condition. Specifically, such deflections may include some or all of the following, without limitation: deflection of z-stage 140; deflection of fiducial plate 122; and deflection of probe card 132, fixture 131, or both.

Stage Deflection Measurement Effects

As set forth above, electrical planarity is conventionally measured by slowly moving, or "overtraveling," a reference surface (such as plate reference surface 121) relative to a reference surface 135 associated with probe card fixture 131. In the case of a probe card analyzer (such as indicated by reference numeral 100 in FIG. 1) that measures planarity optically via comparative metrology, an appropriate reference surface is typically plate reference surface 121. Planarity for probe card 132 may be recorded as the location of z-stage 140 (along the z-axis) relative to plate reference surface 121 at the point where the lowest probe 133 first makes electrical contact with fiducial plate 122. This stage location (in the z dimension) generally is considered to represent the location of plate reference surface 121 relative to reference surface 135 of probe card fixture 131.

Figure 2:
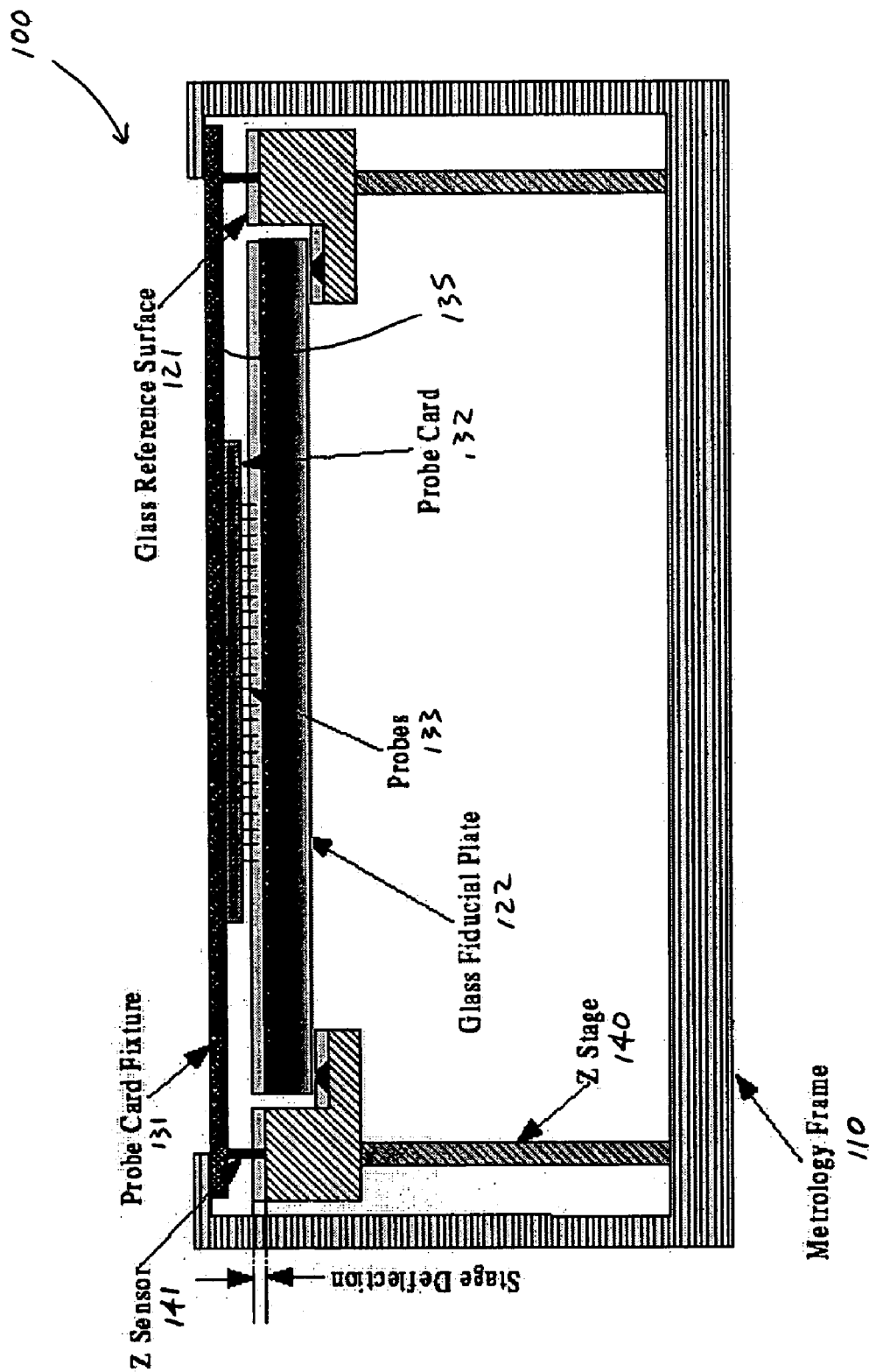
FIG. 2 is a simplified block diagram illustrating exemplary z-stage deflection under contact loading due to overtravel.

FIG. 2 is a simplified block diagram illustrating exemplary z-stage deflection under contact loading due to overtravel. As illustrated in FIG. 2, a problem may arise as loads develop during overtravel. Specifically, z-stage 140 may tend to deflect in the z direction, flex about one or more axes, or otherwise to deform relative to reference surface 135 of fixture 131 due to structural compliance; additionally or alternatively, as addressed below, flexure or other deformation may occur in fixture 131, probe card 132, or both due to the same forces exerted by the contact loading on probes 133. By way of example, the left side of FIG. 2 illustrates a deflection of plate reference surface 121 relative to reference surface 135 of probe card fixture 131. If a base-line or tare z-position of stage 140 that is used to infer planarity is taken from a remote measurement that neither observes nor accounts for such deflection effects (e.g., a measurement acquired from a motor shaft encoder near the base of metrology frame 110), error may be introduced into the planarity measurement.

One exemplary mechanism which may effectively eliminate the foregoing error employs a direct measurement acquired as close as possible to plate reference surface 121 and reference surface 135 associated with probe card fixture 131. In that regard, the FIG. 2 embodiment is illustrated as employing a direct measurement sensor (z-sensor 141) appropriately disposed proximate both plate reference surface 121 and reference surface 135 associated with probe card fixture 131. Electrical planarity measurements based upon, or taking into account, these proximal sensor measurements may significantly reduce errors induced by deflection of stage 140.

Fiducial Surface Deflection

Figure 3:
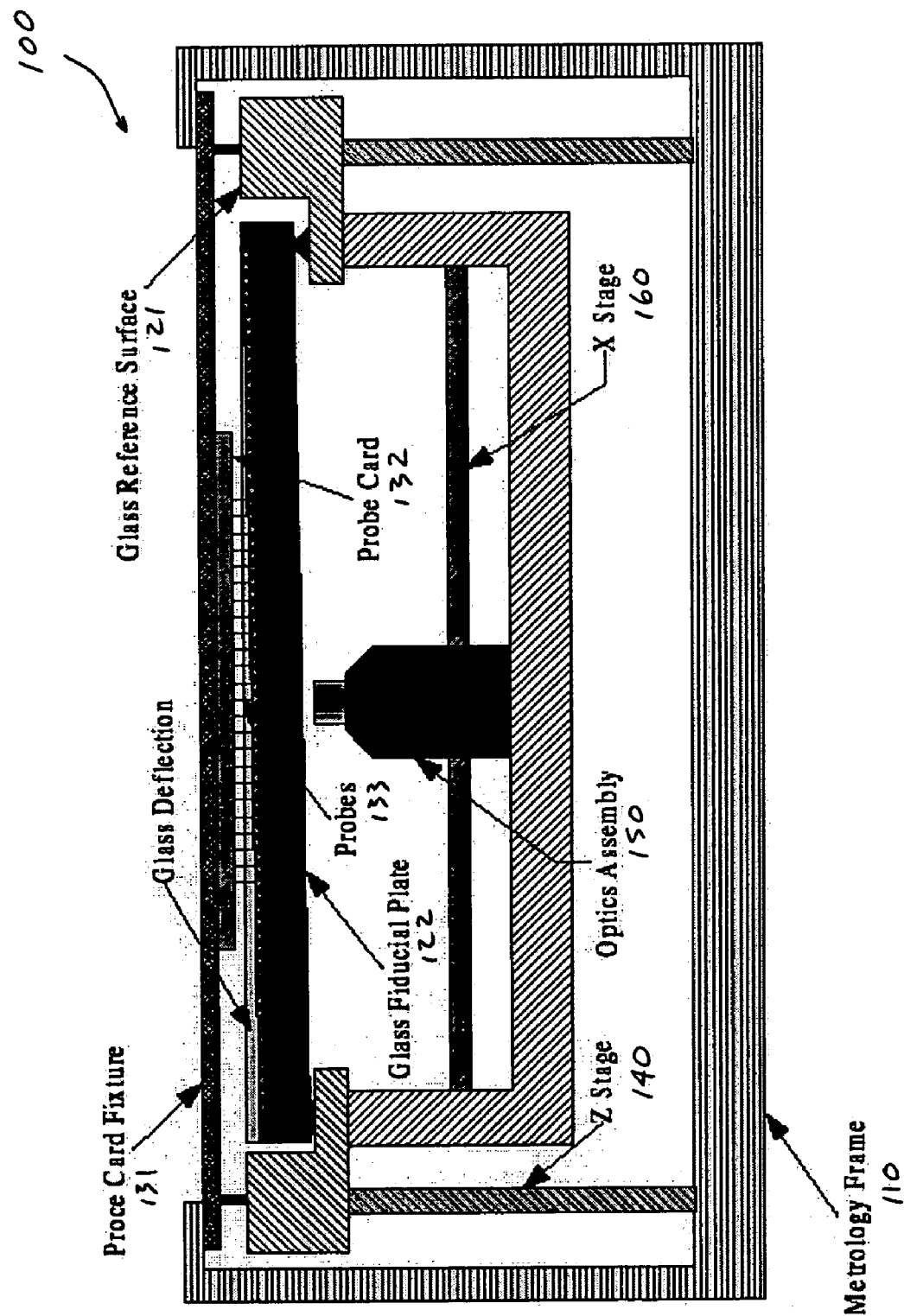
FIG. 3 is a simplified block diagram illustrating exemplary fiducial plate deflection under contact loading due to overtravel.

Under load from probes 133 which have been overtraveled, fiducial plate 122 may deflect, flex, warp, or otherwise deform. Such deflection typically has two primary components: rigid body deflection of fiducial plate 122 due to compliance at its supports; and bending deflection due to compliance of fiducial plate 122 itself. Such deflection may result in reduced, and potentially non-uniform, overtravel of one or more probes 133 over the probe array. In that regard, FIG. 3 is a simplified block diagram illustrating exemplary fiducial plate deflection under contact loading due to overtravel.

In accordance with the exemplary embodiment, a system and method as set forth herein may accurately measure the amount of deflection that has occurred in the area of fiducial plate 122 that actually contacts the array of probes 133; accordingly, commanded overtravel may be compensated to nullify or to mitigate undesirable effects of the quantified deflection. Specifically, net resultant overtravel may closely approximate desired overtravel. It will be appreciated that the only portion of deflection remaining uncompensated may be deflection of fiducial plate 122 within the area actually making contact with the array of probes 133. In practice, this component of deflection is much less significant than the other deflection components that are identified, and may thus be considered negligible.

As set forth above, the exemplary optical metrology techniques described herein are generally three-dimensional comparative metrology analyses employing or comprising stereoscopic imaging processes and a substantially transparent fiducial plate 122. In addition to measuring probe planarity and alignment, these optical analytical methodologies may also be capable of measuring deflection of fiducial plate 122 relative to optics assembly 150.

Figure 4:
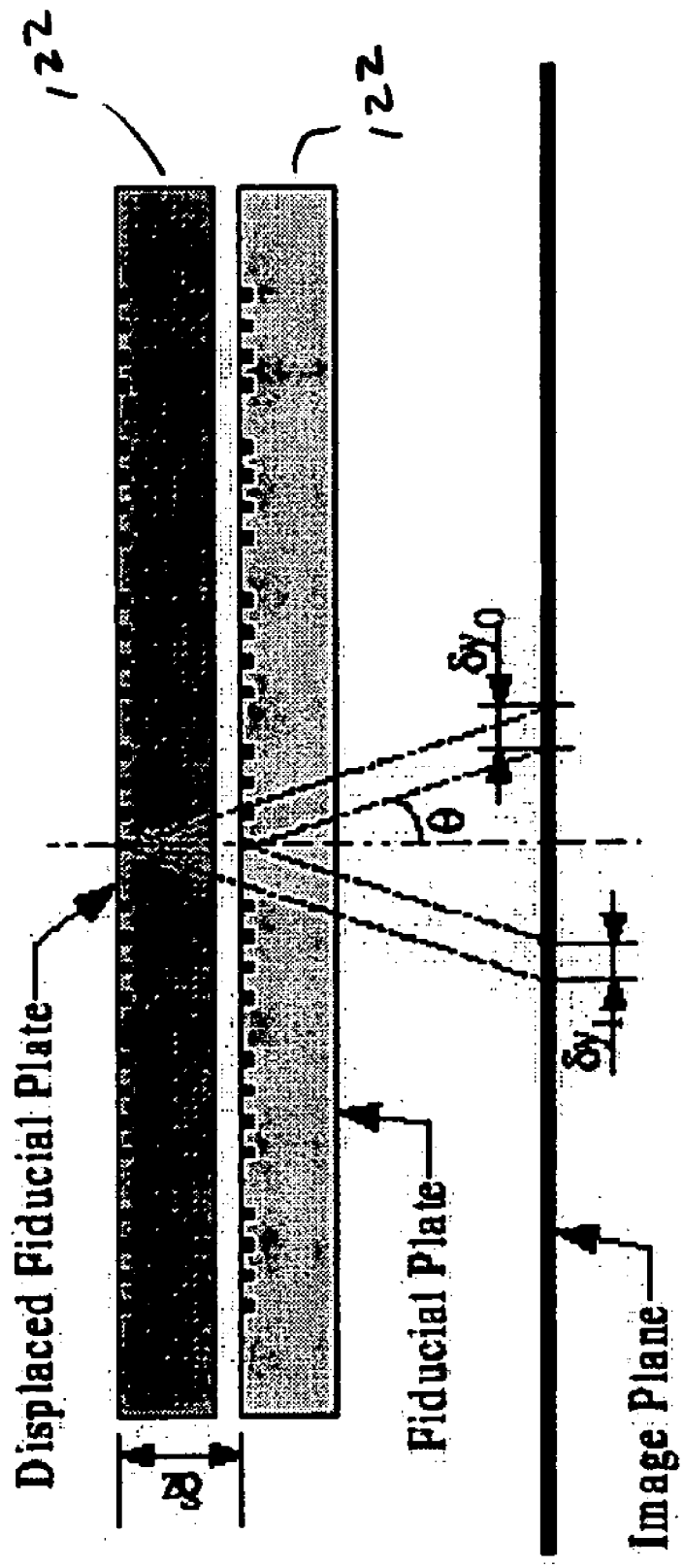
FIG. 4 is a simplified block diagram illustrating one embodiment of a technique for measuring fiducial plate deflection.

FIG. 4 is a simplified block diagram illustrating one embodiment of a technique for measuring fiducial plate deflection. In one imaging operation, a fiducial grid network disposed on, or incorporated in the structure of, fiducial plate 122 may be imaged from two perspectives. This imaging operation may result in acquisition of visual or other image data of the fiducial grid in a no-load situation, i.e., fiducial plate 122 is not under loading for purposes of this imaging process. The position of the fiducial array (in a no-load condition) may be measured from each imaging perspective.

In another imaging operation, a load (such as may be expected during overtravel in a probe analysis application, for example) may be applied to fiducial plate 122; as set forth above, fiducial plate 122 may deflect under such a load. The fiducial grid network may then be imaged, again from two perspectives. In some applications, including the exemplary embodiment illustrated in FIG. 4, these perspectives may correspond to those employed in the no-load imaging process; alternatively, in some more sophisticated imaging techniques, one or both perspectives may differ from the perspectives used for the no-load imaging process. Based upon this loaded imaging operation (i.e., acquisition of visual or other image data), measurements may then be taken of the grid structure (in the loaded condition) from each imaging perspective.

It will be appreciated that the order in which the foregoing imaging operations are conducted may not be important, or may be of only tangential importance; in some applications, either the loaded or the no-load condition may be imaged first. In some exemplary embodiments, the imaging processes may be iterated or alternated one or more times to prevent calibration errors or to mitigate the effects thereof. As illustrated in FIG. 4, fiducial plate 122 is deflected a distance, $\delta_z$. Changes in apparent location (e.g., in the loaded condition) of one or more elements of the fiducial grid relative to the original location (e.g., in the no-load condition) may be expressed as $\delta_{y0}$ and $\delta_{y1}$, for each respective perspective. This geometry is depicted in FIG. 4, where the z axis is vertical and the y axis is horizontal in the plane of the figure. The viewing angle of optics assembly 150 off normal from each perspective is defined by the angle $\theta$.

Given the geometry in FIG. 4, it is possible to compute the deflection in fiducial plate 122 relative to the no-load condition via Equation (1):

$$\delta_z = (\delta_{y0} + \delta_{y1})/2 \tan \theta \quad (1)$$

Individual deflections may be mapped over the area of fiducial plate 122 that is in contact with probes 133 to produce a set of measurements representing a number, n, of deflections over the contact area, as set forth below in Equation (2)

$$p_{1i} = (x_i, y_i, \delta_{g1i})(i=1, 2, \ldots, n) \quad (2)$$

where $x_i$ and $y_i$ are the x and y locations of the deflection measurement, and $\delta_{g1i}$ is the measured deflection (in the z direction) in fiducial plate 122. It is noted that the x axis is normal to the plane of FIG. 4.

Individual points, $p_{1i}$, may be fit to a best-fit plane by various methods such as a linear least squares technique, for example, or some other suitable statistical methodology. From the plane fit, all of the following physical characteristics fiducial plate 122 may be extracted: the deflection at the center ($\delta_{g1center}$); the pitch angle about the x axis, $\theta_{g1}$; and the roll angle about the y axis, $\Phi_{g1}$.

In accordance with the foregoing plane fit or a similar quantitative deflection analysis operation, z-stage 140 may be manipulated or otherwise controlled to perform an incremental move in z, pitch, roll, or some combination thereof, to perform a first order correction for measured deflections. Such an incremental move or positional adjustment may be made relative to the nominal overtravel position, and may generally be defined as set forth in Equations 3–5 below:

$$\Delta z_{1cmd} = -\delta_{g1center} \quad (3)$$

$$\theta_{1cmd} = -\theta_{g1} \quad (4)$$

$$\Phi_{1cmd} = -\Phi_{g1} \quad (5)$$

where axial rotations are performed about the center of fiducial plate 122.

These incremental moves or adjustments may have the effect of establishing a first order correction for deflection effects. In many cases, this first order correction will be sufficient to accommodate the dominant deflection characteristics, to correct for any effects caused thereby, and to model a desired level of uniform overtravel. Due largely to flexure, deformation, or other material deflection or compliance, it is possible that the full extent of the commanded or desired incremental move (whether z translation or x or y rotation) may not be realized in some applications.

In that regard, it will be appreciated that any deviation from the foregoing commanded or desired adjustment generally represents a second order deflection error. If a higher level of accuracy (than that provided by the first order correction set forth above) in compensation is desired, the deflection rate of fiducial plate 122 may also be precisely identified; a second incremental move or adjustment may then enable elimination or minimization of such second order error effects. In some applications, for example, a second order correction may be accomplished by measuring deflection of fiducial plate 122 over the same area as measured prior to the first incremental move. This second deflection analysis may allow acquisition of a set of measurements as expressed below in Equation (6):

$$p_{2i} = (x_i, y_i, \delta_{g2i})(i=1, 2, \ldots, n) \quad (6)$$

Again, these measurements, $p_{2i}$, may be fit to a best-fit plane, such as with a linear least squares technique or other suitable statistical mechanism, to identify the central deflection and rotations of fiducial plate 122 ($\delta_{g2center}$, $\theta_{g2}$, and $\Phi_{g2}$). The second order translational and rotational deflection rates may be computed via Equations (7–9):

$$f_z = (\delta_{g2center} - \delta_{g1center})/\delta_{g1center} \quad (7)$$

$$f_\theta = (\theta_{g2} - \theta_{g1})/\theta_{g1} \quad (8)$$

$$f_\Phi = (\Phi_{g2} - \Phi_{g1})/(\Phi_{g1}) \quad (9)$$

An additional incremental overtravel command, relative to the nominal overtravel position (i.e., no deflection compensation position), may then be expressed as follows in Equations (10–12):

$$\Delta z_{1cmd} = -\delta_{g1center}[1/(1-f_z)] \quad (10)$$

$$\theta_{1cmd} = -\theta_{g1}[1/(1-f_\theta)] \quad (11)$$

$$\Phi_{1cmd} = -\Phi_{g1}[1/(1-f_\Phi)] \quad (12)$$

At the completion of such a second incremental move, with the exception of errors due to bending variations in fiducial plate 122 over the array of probes 133, the full desired overtravel may be achieved.

Probe Card and Fixture Deflection

In accordance with some embodiments, deflection effects caused by deflection or other deformation of probe card 132, of fixture 131, or of both may be considered. Assuming no a priori knowledge of the relative compliance of the two foregoing components, the compliance effects of each may be combined together, and therefore a combined card/fixture deflection measurement may be obtained.

In one exemplary embodiment, the relationship between measured optical planarity and electrical planarity may be expressed generally as set forth below in Equation (13):

$$p_{einb} = p_{oinb} + \delta_{ginb} + \delta_{cfinb} + \delta_{sinb} \quad (13)$$

The quantities $p_{einb}$ and $p_{oinb}$ represent the electrical and optical planarity, respectively, at a non-bussed probe, $i_{nb}$. The remaining three terms, $\delta_{ginb}$, $\delta_{cfinb}$, and $\delta_{sinb}$, represent the deflection of fiducial plate 122, the combined probe card/fixture deflection, and the deflection of z-stage 140, respectively, at a non-bussed probe, $i_{nb}$, at the time of its first electrical contact. As set forth in detail above with specific reference to FIG. 2, the term $\delta_{sinb}$ may be made effectively zero, for example, using appropriate z-sensor data from a suitable location.

Solving for the card/fixture deflection, $\delta_{cfinb}$, in Equation (13) yields:

$$\delta_{cfinb} = p_{einb} - p_{oinb} - \delta_{ginb} - \delta_{sinb} \quad (14)$$

The sole unknown term in Equation (14) is the deflection in fiducial plate 122 at first electrical contact, $\delta_{ginb}$. The present disclosure contemplates several mechanisms for measuring or estimating this first touch plate deflection, $\delta_{ginb}$.

The most direct method of computing $\delta_{ginb}$ is to adjust optical assembly 150 to image directly opposite each probe 133 as it makes contact with fiducial plate 122, and to measure the deflection of fiducial plate 122 at that point. This approach, however, comes at the expense of both complexity and time, as two-dimensional motion of optics assembly 150 (in both the x and y directions), fiducial plate 122, or both, is required accurately to position optics assembly 150 and to measure the deflection of fiducial plate 122 at each probe 133 as it comes into first contact.

Another approach for computing $\delta_{ginb}$ is based upon an assumption that loading of fiducial plate 122, both with respect to forces and to roll and pitch moments, may be treated as approximately linear with total cumulative probe overtravel. In this context, the term "total cumulative probe overtravel" generally refers to the sum of all the overtravel components (each of which may be respectively attributable to each individual probe 133) from respective first touch to the current position. For most probe cards under typical probe to fiducial plate leveling conditions, this assumption of linear total cumulative loading is a good assumption. One notable exception arises in the case of probe cards utilizing vertical buckle beam technology, but even this technology has linearly increasing loads from first touch to the point just prior to buckling.

Given the foregoing linearity assumption, the first touch fiducial plate deflection may be calculated as a function of full overtravel fiducial plate deflection, $\delta_{gfinb}$, at a particular probe ($i_{nb}$) and knowledge of the optical planarity, $p_{oinb}$.

Initially, the total cumulative overtravel from first touch to the final overtravel position may be determined in accordance with Equation (15):

$$OT_{total} = \begin{cases} \sum_{i=0}^{n} z_{final} - p_{0_i} & \text{linear technology} \\ \sum_{i=0}^{n} \min(z_{final} - p_{0_i}, \delta_{zbuckle}) & \text{buckle beam technology} \end{cases} \quad (15)$$

where the quantity $z_{final}$ generally represents the final overtravel position as determined by Equation (10) set forth above, and the quantity $\delta_{zbuckle}$ generally represents the probe buckling distance. Then, for every probe, i, the total linear overtravel required to reach it from first touch is given by Equation (16) set forth below. In this context, "total linear overtravel" refers to the total overtravel distance over which the loads are linearly increasing with displacement.

$$OT_i = \quad (16)$$
$$\begin{cases} \sum_{j=1}^{n} \max(p_{0_i} - p_{0_j}, 0) & \text{linear technology} \\ \sum_{j=1}^{n} \min(\max(p_{0_i} - p_{0_j}, 0), \delta_{zbuckle}) & \text{buckle beam technology} \end{cases}$$

Under the assumption of load linearity with cumulative overtravel, the fiducial plate deflection at first touch is simply expressed as the fiducial plate deflection at full overtravel multiplied by the ratio of the cumulative overtravel to first touch to the total cumulative overtravel. This is expressed mathematically as set forth below in Equation (17):

$$\delta_{ginb} = \delta_{gfinb}(OT_{inb}/OT_{total}) \quad (17)$$

Given Equation (14), the combined card/fixture deflection at every non-bussed probe, $i_{nb}$, may be computed. Fixture deflection at other locations can readily be determined and quantified by two dimensional interpolation.

Load Compensated Optical Planarity

Equation (13) sets forth a relationship between electrical and optical planarity. This equation allows loaded planarity to be calculated. By taking the measured optical planarity for a given probe and adding the first touch card/fixture deflection observed at that probe, the equivalent loaded planarity may be expressed as indicated in Equation (18):

$$p_{1i} = p_{oi} + \delta_{cf}(x_i, y_i) \quad (18)$$

The term $\delta_{cf}(x_i, y_i)$ in Equation (18) requires a two dimensional interpolation to evaluate. This interpolation to model characteristics at the location of a probe, i, may be performed on the ordered triplet of data $(x_{inb}, y_{inb}, \delta_{cfinb})$ evaluated at a point $(x_i, y_i)$.

Figure 5:
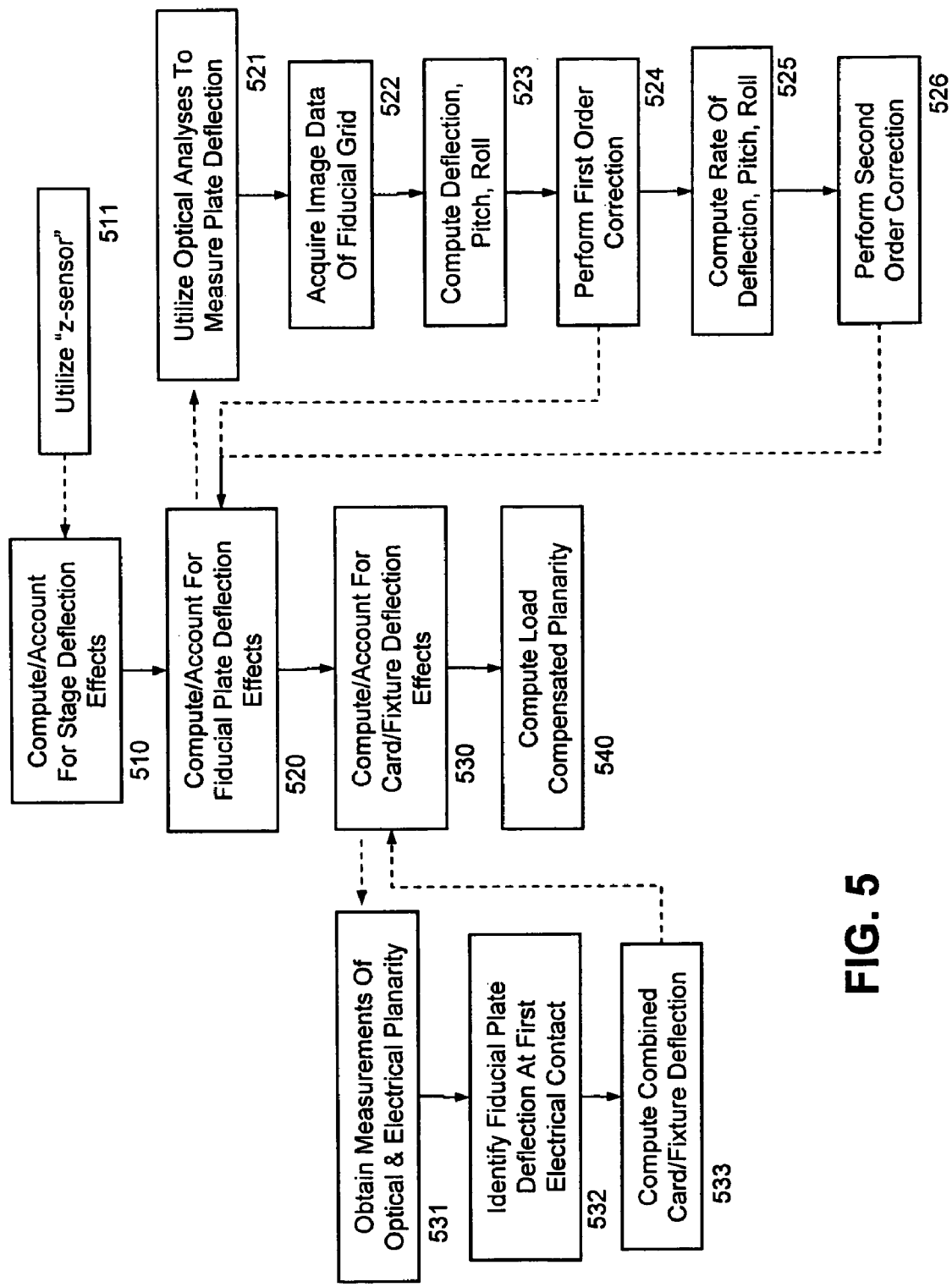
FIG. 5 is a simplified flow diagram illustrating the general operation of one embodiment of a method of obtaining planarity measurements in a probe card analysis system.

FIG. 5 is a simplified flow diagram illustrating the general operation of one embodiment of a method of obtaining planarity measurements in a probe card analysis system. As indicated at the center of FIG. 5, an exemplary method of obtaining planarity measurements may generally comprise computing or accounting for stage deflection effects (block 510), computing or accounting for fiducial plate deflection effects (block 520), computing or accounting for probe card and probe fixture deflection effects (block 530), and computing load compensated planarity (block 540).

One exemplary mechanism for mitigating stage deflection effects contributing to planarity errors employs a direct measurement acquired as close as possible to the fiducial plate and to the probe card fixture, i.e., acquiring stage deflection measurements at proximal sensor locations, where "proximal" in this context generally refers to the vicinity of the fiducial plate and the probe card fixture where stage deflection is most likely to occur. Applications employing an appropriately disposed direct measurement sensor were described above with specific reference to FIGS. 1 and 2. As indicated at block 511, accounting for planarity effects due to stage deflection may comprise utilizing a distance sensor (e.g., z-sensor 141 in the FIG. 2 embodiment) proximate to the stage deflection.

Various methods of computing fiducial plate deflection effects such as depicted at block 520 are set forth in detail above with specific reference to FIGS. 3 and 4. Specifically, the operation at block 520 represents a process by which the amount of deflection that has occurred in the area of the fiducial plate that contacts the array of probes may be accurately measured.

As set forth above, optical analyses for measuring fiducial plate deflection (block 521) may involve acquiring image data of one or more fiducials in a grid or predetermined pattern on the fiducial plate (block 522). The image data acquisition process depicted at block 522 may employ a CCD or CMOS device, for example, and may additionally require or benefit from other optical components. In some embodiments, image data may be acquired from different perspectives, such as from two or more perspectives, and under different load conditions, such as a loaded condition and a no-load condition. In particular, the imaging operation at block 522 may result in acquisition of visual or other image data of the fiducial grid in a no-load condition and in a loaded condition, wherein each condition is imaged from two perspectives. Accordingly, measurements may be taken of the grid structure under differing conditions and from multiple imaging perspective.

The foregoing measurements may be employed to compute deflection, pitch, and roll of the fiducial plate (block 523) which may be compensated, for example, with a first order correction (block 524) as set forth above with particular reference to Equations 1–5. The dashed arrow from block 524 back to block 520 is intended to indicate that accounting for fiducial plate deflections may terminate at block 524, i.e., second or higher order corrections may be neither required nor desired. Deflection, pitch, and roll rates for the fiducial plate (block 525) may additionally be computed, allowing a second order correction (block 526) as set forth above with reference to Equations 6–12. Those of skill in the art will appreciate that the exemplary computations set forth herein are susceptible of numerous modifications and may be altered or influenced by, for example, overall system configuration and mechanical precision, resolution of the imaging apparatus employed, computational capabilities of data processing components, desired accuracy of corrections, and other factors. Corrections beyond the second order are also possible and may readily be implemented with appropriate hardware and data processing capabilities.

As indicated in FIG. 5, computing or accounting for probe card and probe card fixture deflection effects (block 530) may generally comprise obtaining measurements of optical planarity and measurements of electrical planarity (block 531) for all non-bussed probes, identifying fiducial plate deflection at first electrical contact (block 532) at all non-bussed probe locations, and computing a combined deflection (block 533) attributable to deflection of the probe card and deflection of the probe card fixture. By way of example, the various operations depicted at blocks 530–533 may be executed substantially as set forth above with specific reference to Equations 13–17.

Similarly, computing the load compensated planarity (block 540) may be executed substantially as described above. The relationship between electrical and optical planarity, such as expressed in Equation (13), for example, may allow loaded planarity to be calculated as a function of the measured optical planarity for a given probe and the first touch card/fixture deflection observed at that probe.

Aspects of the present invention have been illustrated and described in detail with reference to particular embodiments by way of example only, and not by way of limitation. It will be appreciated that various modifications and alterations may be made to the exemplary embodiments without departing from the scope and contemplation of the present disclosure. It is intended, therefore, that the invention be considered as limited only by the scope of the appended claims

What is claimed is:

1. A method of obtaining planarity measurements in a probe card analysis system; said method comprising:
   computing planarity effects due to fiducial plate deflection;
   combining planarity effects due to probe card deflection and due to probe card fixture deflection; and
   responsive to said computing and said combining, calculating a load compensated planarity for said probe card.

2. The method of claim 1 further comprising accounting for planarity effects due to stage deflection and wherein said calculating is further responsive to said accounting.

3. The method of claim 2, wherein said accounting comprises utilizing a distance sensor proximate to said stage deflection.

4. The method of claim 1 wherein said computing comprises utilizing an optical metrology technique.

5. The method of claim 4 wherein said utilizing an optical metrology technique comprises:
   acquiring image data of a fiducial on said fiducial plate;
   responsive to said acquiring, identifying deflection data values representative of a
   deflection of said fiducial plate; and
   responsive to said identifying, providing correction data values enabling a first order correction of said deflection.

6. The method of claim 5 wherein said utilizing an optical metrology technique further comprises:
   further identifying rate data values representative of a rate of deflection of said fiducial plate; and
   responsive to said further identifying, providing additional correction data values enabling a second order correction of said deflection.

7. The method of claim 1 wherein said combining comprises:
   obtaining measurements of optical planarity and electrical planarity for said probe card;
   measuring fiducial plate deflection at first electrical contact; and
   responsive to said obtaining and said measuring, computing a combined deflection value for said probe card and said probe card fixture.

* * * * *

UNITED STATES PATENT AND TRADEMARK OFFICE
CERTIFICATE OF CORRECTION

| | |
|---|---|
| PATENT NO. | : 7,170,307 B2 |
| APPLICATION NO. | : 10/799575 |
| DATED | : January 30, 2007 |
| INVENTOR(S) | : John T. Strom et al. |

Page 1 of 1

It is certified that error appears in the above-identified patent and that said Letters Patent is hereby corrected as shown below:

On title page, item (73) Inventor
 replace "John T. Strom, North Bend, WA (US)"
 with --John T. Strom, North Bend, WA (US) and Raymond Kraft, Seattle, WA (US)--.

Signed and Sealed this

Twenty-sixth Day of June, 2007

JON W. DUDAS
*Director of the United States Patent and Trademark Office*